United States Patent
Krohn

(10) Patent No.: US 6,805,917 B1
(45) Date of Patent: Oct. 19, 2004

(54) UV CURABLE COMPOSITIONS FOR PRODUCING DECORATIVE METALLIC COATINGS

(76) Inventor: Roy C. Krohn, 3540 Orvall Dr., Fort Gratiot, MI (US) 48059

( * ) Notice: Subject to any disclaimer, the term of this patent is extended or adjusted under 35 U.S.C. 154(b) by 228 days.

(21) Appl. No.: 10/148,912
(22) PCT Filed: Dec. 6, 2000
(86) PCT No.: PCT/US00/42605
§ 371 (c)(1), (2), (4) Date: Jun. 5, 2002
(87) PCT Pub. No.: WO01/40387
PCT Pub. Date: Jun. 7, 2001

Related U.S. Application Data
(60) Provisional application No. 60/169,247, filed on Dec. 6, 1999.

(51) Int. Cl.$^7$ ................... C09D 4/00; C08J 7/04
(52) U.S. Cl. .......... 427/510; 427/512; 522/8; 522/18; 522/25; 522/39; 522/42; 522/44; 522/81; 522/103
(58) Field of Search ............ 522/103, 81, 83, 522/42, 39, 44, 31, 8, 18, 25; 427/512, 510; 524/430, 437, 439, 441

(56) References Cited

U.S. PATENT DOCUMENTS

| | | |
|---|---|---|
| 3,700,754 A | 10/1972 | Schmitt et al. |
| 3,953,643 A | 4/1976 | Cheung et al. |
| 3,968,056 A | 7/1976 | Bolon et al. |
| 3,988,647 A | 10/1976 | Bolon et al. |
| 4,049,844 A | 9/1977 | Bolon et al. |
| 4,088,801 A | 5/1978 | Bolon et al. |
| 4,113,894 A | 9/1978 | Koch, II |
| 4,187,340 A | 2/1980 | Oishi et al. |
| 4,188,449 A | 2/1980 | Lu et al. |
| RE30,274 E | 5/1980 | Bolon et al. |
| 4,256,591 A | 3/1981 | Yamamoto et al. |
| 4,271,212 A | 6/1981 | Stengle |
| 4,338,376 A | 7/1982 | Kritzler |
| 4,391,858 A | 7/1983 | Batzill |
| RE31,411 E | 10/1983 | Bolon et al. |
| 4,420,500 A | 12/1983 | Nakatani et al. |
| 4,439,494 A | 3/1984 | Olson |
| 4,455,205 A | 6/1984 | Olson et al. |
| 4,478,876 A | 10/1984 | Chung |
| 4,479,860 A | 10/1984 | Hayase et al. |
| 4,495,042 A | 1/1985 | Hayase et al. |
| 4,496,475 A | 1/1985 | Abrams |
| 4,513,023 A | 4/1985 | Wary |
| 4,533,445 A | 8/1985 | Orio |
| 4,539,258 A | 9/1985 | Panush |
| 4,547,410 A | 10/1985 | Panush et al. |
| 4,551,361 A | 11/1985 | Burzynski et al. |
| 4,557,975 A | 12/1985 | Moore |
| 4,594,315 A | 6/1986 | Shibue et al. |
| 4,640,981 A | 2/1987 | Dery et al. |
| 4,665,342 A | 5/1987 | Topp et al. |
| 4,666,821 A | 5/1987 | Hein et al. |
| 4,684,353 A | 8/1987 | deSouza |
| 4,738,899 A | 4/1988 | Bluestein et al. |
| 4,788,108 A | 11/1988 | Saunders, Jr. et al. |
| 4,806,257 A | 2/1989 | Clark et al. |
| 4,814,208 A | 3/1989 | Miyazaki et al. |
| 4,816,717 A | 3/1989 | Harper et al. |
| 4,822,646 A | 4/1989 | Clark et al. |
| 4,828,758 A | 5/1989 | Gillberg-Laforce et al. |
| 4,900,763 A | 2/1990 | Kraushaar |
| 4,911,796 A | 3/1990 | Reed |
| 4,959,178 A | 9/1990 | Frentzel et al. |
| 4,960,614 A | 10/1990 | Durand |
| 4,964,948 A | 10/1990 | Reed |
| 4,975,471 A | 12/1990 | Hayase et al. |
| 5,006,397 A | 4/1991 | Durand |
| 5,049,480 A | 9/1991 | Nebe et al. |
| 5,068,714 A | 11/1991 | Seipler |
| 5,076,963 A | 12/1991 | Kameyama et al. |
| 5,100,848 A | 3/1992 | Enomoto et al. |
| 5,104,929 A | 4/1992 | Bilkadi |
| 5,116,639 A | 5/1992 | Kolk et al. |
| 5,128,387 A | 7/1992 | Shustack |
| 5,128,391 A | 7/1992 | Shustack |
| 5,149,971 A | 9/1992 | McElhaney et al. |

(List continued on next page.)

FOREIGN PATENT DOCUMENTS

| | | |
|---|---|---|
| EP | 0 081 323 A1 | 6/1983 |
| EP | 0 530 141 A1 | 3/1993 |
| EP | 0 711 801 A2 | 5/1996 |
| EP | 0 820 217 A1 | 1/1998 |
| GB | 1 550 382 | 8/1979 |
| WO | WO 97/31051 | 8/1997 |
| WO | WO 97/45458 | 12/1997 |
| WO | WO 98/47954 | 10/1998 |
| WO | WO 98/50317 | 11/1998 |
| WO | WO 00/62586 | 10/2000 |

OTHER PUBLICATIONS

Derwent Abstract Corresponding To JP 5279436.
English Abstract Corresponding To Japanese Application XP–002164191.
English Abstract Corresponding To Japanese Application XP–002140477.
English Abstract Corresponding To Japanese Application XP–002140476.
English Abstract Corresponding To Japanese Application XP–002158399.

*Primary Examiner*—Susan W. Berman
(74) *Attorney, Agent, or Firm*—Brooks Kushman P.C.

(57) ABSTRACT

The present invention discloses an ultraviolet light curable decorative metallic composition and method for making such a composition that may be used to produce a decorative metallic coating on a substrate. The composition comprises a novolac epoxy acrylate prepolymer, a photoinitiator and a metallic pigment. The disclosed composition does not contain any significant amount of volatile organic solvents.

14 Claims, No Drawings

U.S. PATENT DOCUMENTS

| | | | |
|---|---|---|---|
| 5,180,523 A | | 1/1993 | Durand et al. |
| 5,180,757 A | | 1/1993 | Lucey |
| 5,183,831 A | | 2/1993 | Bielat et al. |
| 5,221,560 A | | 6/1993 | Perkins et al. |
| 5,225,170 A | | 7/1993 | Kolk et al. |
| 5,282,985 A | | 2/1994 | Zabinski et al. |
| 5,296,295 A | | 3/1994 | Perkins et al. |
| 5,326,636 A | | 7/1994 | Durand et al. |
| 5,356,545 A | | 10/1994 | Wayte |
| 5,384,160 A | | 1/1995 | Frazzitta |
| 5,395,876 A | | 3/1995 | Frentzel et al. |
| 5,424,182 A | | 6/1995 | Marginean, Sr. et al. |
| 5,436,279 A | * | 7/1995 | Grundke et al. .............. 522/14 |
| 5,453,451 A | | 9/1995 | Sokol |
| 5,454,892 A | | 10/1995 | Kardon et al. |
| 5,462,701 A | | 10/1995 | Hagemeyer et al. |
| 5,470,643 A | | 11/1995 | Dorfman |
| 5,470,897 A | | 11/1995 | Meixner et al. |
| 5,514,214 A | | 5/1996 | Joel et al. |
| 5,523,143 A | | 6/1996 | Hagemeyer et al. |
| 5,556,527 A | | 9/1996 | Igarashi et al. |
| 5,561,730 A | | 10/1996 | Lochkovic et al. |
| 5,565,126 A | | 10/1996 | Kimura et al. |
| 5,587,433 A | | 12/1996 | Boeckeler |
| 5,596,024 A | | 1/1997 | Horie et al. |
| 5,609,918 A | | 3/1997 | Yamaguchi et al. |
| 5,624,486 A | | 4/1997 | Schmid et al. |
| 5,633,037 A | | 5/1997 | Mayer |
| 5,686,792 A | | 11/1997 | Ensign, Jr. |
| 5,698,310 A | | 12/1997 | Nakamura et al. |
| 5,716,551 A | | 2/1998 | Unruh et al. |
| 5,718,950 A | | 2/1998 | Komatsu et al. |
| 5,747,115 A | | 5/1998 | Howell et al. |
| 5,750,186 A | | 5/1998 | Frazzitta |
| 5,773,487 A | | 6/1998 | Sokol |
| 5,784,197 A | | 7/1998 | Frey et al. |
| 5,787,218 A | | 7/1998 | Ohtaka et al. |
| 5,837,745 A | | 11/1998 | Safta et al. |
| 5,866,628 A | | 2/1999 | Likavec et al. |
| 5,871,827 A | | 2/1999 | Jaffe et al. |
| 5,883,148 A | | 3/1999 | Lewandowski et al. |
| 5,888,119 A | | 3/1999 | Christianson et al. |
| 5,914,162 A | | 6/1999 | Bilkadi |
| 5,942,284 A | | 8/1999 | Hiskes et al. |
| 5,945,502 A | | 8/1999 | Hsieh et al. |
| 5,950,808 A | | 9/1999 | Tanabe et al. |
| 5,968,996 A | | 10/1999 | Sanchez et al. |
| 5,994,424 A | | 11/1999 | Safta et al. |
| 6,054,501 A | | 4/2000 | Taniguchi et al. |
| 6,165,386 A | | 12/2000 | Endo et al. |
| 6,211,262 B1 | | 4/2001 | Mejiritski et al. |
| 6,261,645 B1 | | 7/2001 | Betz et al. |
| 6,267,645 B1 | | 7/2001 | Burga et al. |
| 6,290,881 B1 | | 9/2001 | Krohn |
| 6,617,370 B2 | * | 9/2003 | Ueno ........................... 522/6 |

* cited by examiner

UV CURABLE COMPOSITIONS FOR PRODUCING DECORATIVE METALLIC COATINGS

CROSS-REFERENCE TO RELATED APPLICATION

This application is the U.S. national phase of PCT application number PCT/US00/42605, filed Dec. 6, 2000, which further claims the benefit of U.S. provisional application Ser. No. 60/169,247, filed Dec. 6, 1999.

TECHNICAL FIELD

The present invention relates to ultraviolet light curable compositions that may be utilized to produce a decorative metallic coating on a substrate.

BACKGROUND OF THE INVENTION

UV radiation curable paint compositions are applied to a substrate through spraying, screen printing, dipping or brushing for the protection or decoration of the substrate. In the usual application, a substrate such as metals, glass, or plastics is coated with the paint composition and then UV light is introduced to complete the curing process. The UV curable paint compositions offer many advantages over typical heat curable compositions.

Heat curable compositions require the use of organic solvents that contain a significant amount of volatile organic compounds (VOCs). These VOCs escape into the atmosphere while the heat curable composition dries. Such solvent based systems are undesirable because of the hazards and expenses associated with VOCs. The hazards include water and air pollution and the expenses include the cost of complying with strict government regulation on solvent emission levels. In contrast, UV curable compositions contain reactive monomers instead of solvents; thus eliminating the detrimental effects of the VOCs.

The use of heat curable compositions not only raises environmental concerns but other disadvantages exist with their use as well. Heat curable compositions suffer from slow cure times which lead to decreased productivity. These compositions require high energy for curing due to energy loss as well as the energy required to heat the substrate. Additionally, many heat curable compositions yield poor film properties that result in decreased value of the end product.

Although UV curable compositions exhibit superior properties and performance over their heat curable counterparts, UV curable compositions themselves suffer from certain disadvantages. Generally, UV compositions have high molecular weights and a substantial degree of cross linkage due to the highly reactive nature of the composition. As a result, many of these compositions suffer from low durability and resin shrinkage. With the use of many such compositions, an inordinately high amount of UV light is required to cure. New formulations that lessen these problems typically suffer from diminished abrasion, chemical, and scratch resistance as well as low thermal stability and adhesion.

An addition disadvantage of typical UV compositions is their lack of stability which results in dispersion. With some compositions, suspended solids fall out of solution after a period of one to two days. Dispersion adversely affects the gloss and clarity of the finished product. To combat this problem, new compositions have been formulated with higher viscosities which often lessen the flowability of the composition. These viscous formulations rule out spray application and provide for an unsuitably high dipping thickness.

Accordingly, there exists a need to provide environmentally safe UV curable paint compositions which exhibit improved weatherability, corrosion resistance and workability. Additionally, there is a need to provide a method of applying the composition which furthers the goal of improved performance.

SUMMARY OF INVENTION

It is an object of the present invention to provide an improved composition that upon curing by ultraviolet light produces a decorative metallic coating.

It is another object of the present invention to provide an improved decorative metallic composition that can be applied by spraying, screen printing, dipping, and brushing.

The present invention discloses an ultraviolet light curable decorative metallic composition and method for making such a composition that may be used to produce a decorative metallic layer. The disclosed composition does not contain any significant amount of volatile organic solvents that do not become incorporated in the active layer after curing. Specifically, the decorative metallic composition contains 5% or less volatile organic solvents by weight.

In accordance with one aspect of the invention, an ultraviolet light curable decorative metallic composition is provided. The decorative metallic composition comprises an acrylated epoxy oligomer in an amount of about 20% to 45%, an isobornyl acrylate monomer in an amount of about 15% to 40% of the decorative metallic composition, a photoinitiator in an amount of about 4% to 14% of the decorative metallic composition, a flow promoting agent in an amount of 0% to 8% of the decorative metallic composition, and a metallic pigment in an amount of 5% to 40%. All percentages of the decorative metallic composition as expressed in this document refer to the weight percentage of the stated component to the total weight of the decorative metallic composition in its fluid state at standard temperature and pressure.

In accordance with yet another aspect of the invention, a method is provided for depositing a decorative metallic coating on a substrate. The method comprises a first step of applying to the substrate a decorative metallic fluid-phase composition ("decorative metallic composition"). The decorative metallic composition includes an acrylated epoxy oligomer in an amount of about 20% to 45%, an isobornyl acrylate monomer in an amount of about 15% to 40% of the decorative metallic composition, a photoinitiator in an amount of about 4% to 14% of the decorative metallic composition, a flow promoting agent in an amount of 0% to 8% of the decorative metallic composition, and a metallic pigment in an amount of 5% to 40%.

The method also includes a second step of illuminating the decorative metallic composition on the substrate with an ultraviolet light to cause the decorative metallic composition to cure into the decorative metallic coating.

In accordance with this method, the decorative metallic composition can be selectively deposited on the substrate at specific locations where decorative metallic plating is desired. It need not be applied to the entire substrate.

BEST MODE FOR CARRYING OUT THE INVENTION

Decorative metallic Compositions

Reference will now be made in detail to presently preferred compositions or embodiments and methods of the invention, which constitute the best modes of practicing the invention presently known to the inventor.

In accordance with one aspect of the invention, a presently preferred ultraviolet light curable decorative metallic composition ("decorative metallic composition") is provided. In this preferred embodiment, the decorative metallic composition includes an acrylated epoxy oligomer. The acrylated epoxy oligomer is present in an amount of about 20% to 45%. The acrylated epoxy oligomer is more preferably present in an amount of about 35% to 45%, and most preferably about 40%. Suitable acrylated epoxy oligomers include Radcure Ebecryl 3603 (novolac epoxy acrylate diluted 20% by weight with tripropylene glycol diacrylate), commercially available from Radcure UCB Corp.; Sartomer CN-120 (difunctional bisphenol based epoxy acrylate) and CN-124 (difunctional bisphenol based epoxy acrylate), commercially available from Sartomer Corp.; and Echo Resin TME 9310 and 9345, commercially available from Echo Resins. The preferred acrylated epoxy oligomer is Ebecryl 3603, which is a tri-functional acrylated epoxy novolac. Combinations of these materials may also be employed herein.

The preferred decorative metallic composition also includes an isobornyl acrylate monomer in an amount of about 15% to 40%. The isobornyl acrylate monomer is more preferably present in an amount of about 25% to 35%, and most preferably about 28%. Suitable isobornyl acrylate monomers include Sartomer SR-423 (isobornyl methacrylate):

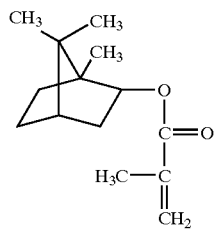

and SR-506 (isobornyl acrylate):

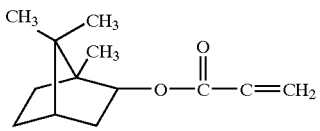

available from Sartomer Corp.; Radcure IBOA (isobornyl acrylate), commercially available from Radcure Corp.; IBOA and IBOMA, commercially available from CPS Chemical; and Genomer 1121, commercially available from Rahn Radiation Curing. The preferred isobornyl acrylate monomers is Radcure IBOA, commercially available from Radcure Corp. Radcure IBOA is a high purity, low color monomer. Combinations of these materials may also be employed herein.

This preferred decorative metallic composition also includes a photoinitiator in an amount of about 4% to 14% of the decorative metallic composition. The photoinitiator is more preferably present in an amount of about 8% to 12%, and most preferably about 10%. Suitable photoinitiators include Irgacure 184 (1-hydroxycyclohexyl phenyl ketone); Irgacure 907 (2-methyl-1-[4-(methylthio)phenyl]-2-morpholino propan-1-one); Irgacure 369 (2-benzyl-2-N,N-dimethylamino-1-(4-morpholinophenyl)-1-butanone); Irgacure 500 (the combination of 50% by weight 1-hydroxy cyclohexyl phenyl ketone and 50% by weight benzophenone); Irgacure 651 (2,2-dimethoxy-2-phenyl acetophenone); Irgacure 1700 (the combination of 25% by weight bis(2,6-dimethoxybenzoyl-2,4-,4-trimethyl pentyl phosphine oxide and 75% by weight 2-hydroxy-2-methyl-1-phenyl-propan-1-one); Darocur 1173 (2-hydroxy-2-methyl-1-phenyl-1-propane); and Darocur 4265 (the combination of 50% by weight 2,4,6-trimethylbenzoyldiphenyl-phosphine oxide and 50% by weight 2-hydroxy 2-methyl-1-phenyl-propan-1-one)available commercially from Ciba-Geigy Corp., Tarrytown, N.Y.; CYRACURE UVI-6974 (mixed triaryl sulfonium hexafluoroantimonate salts) and CYRACURE UVI-6990 (mixed triaryl sulfonium hexafluorophosphate salts) available commercially from Union Carbide Chemicals and Plastics Co. Inc., Danbury, Conn.; and Genocure CQ, Genocure BOK, and Genocure M. F., commercially available from Rahn Radiation Curing. The preferred photoinitiator is IRGACURE 1700 commercially available from Ciba-Geigy of Tarrytown, N.Y. Combinations of these materials may also be employed herein.

The composition still further includes a flow promoting agent in an amount of about 0.0% to 8.0%, and preferably about 6.0%, of the topcoat composition. Suitable flow promoting agents include Genorad 17, commercially available from Rahn Radiation Curing; and Modaflow, commercially available from Monsanto Chemical Co., St. Louis, Mo. The preferred flow promoting agent is Modaflow which is an ethyl acrylate and 2-ethylhexyl acrylate copolymer that improves the flow of the composition. Combinations of these materials may also be employed herein.

The preferred paint composition also includes a pigmented composition in an amount of about 5% to 40% of the decorative metallic composition. The pigmented composition is more preferably present in an amount of about 10% to 25%, and most preferably about 20%. Suitable pigmented compositions include Venus #91 pigment and Palegold #400 available from NazDar; and A1 #200 pigment available from Silberlne. The preferred pigment used will depend on the desired color of the paint. Combinations of these materials may also be employed herein.

To illustrate, the following example sets forth a presently preferred decorative metallic composition according to this aspect of the invention.

EXAMPLE 1

This example provides a preferred gold decorative metallic composition according to the invention. The decorative metallic composition was made from the following components:

| Component | Approximate Weight % |
| --- | --- |
| IBOA | 25.5 |
| IRGACURE 1700 | 9.1 |
| Ebecryl 3603 | 34.5 |
| Modaflow | 3.6 |
| Venus #91 | 27.3 |
| Gold | |
| Total | 100.00 |

In this example the IBOA and Irgacure 1700 are mixed in a pan with a propeller blade mixer for 30 seconds at a speed of 500 to 1000 rpm. In the next step, the Modaflow and the Ebecryl 3603 are introduced into the pan and mixed for 1 to 2 minutes at a speed of 2000 rpm. In the final step, the Venus

91 is introduced into the pan and mixed for 1 to 2 minutes at a speed of 2000 rpm. The temperature during mixing is monitored. The mixing is temporarily suspended if the temperature exceed 100° F.

EXAMPLE 2

This example provides a preferred aluminum decorative metallic composition according to the invention. The decorative metallic composition was made from the following components:

| Component | Approximate Weight % |
| --- | --- |
| IBOA | 31.1 |
| IRGACURE 1700 | 11.1 |
| Ebecryl 3603 | 42.2 |
| Modaflow | 4.5 |
| Al #200 | 11.1 |
| Total | 100.00 |

In this example the IBOA and Irgacure 1700 are mixed in a pan with a propeller blade mixer for 30 seconds at a speed of 500 to 1000 rpm. In the next step, the Modaflow and the Ebecryl 3603 are introduced into the pan and mixed for 1 to 2 minutes at a speed of 2000 rpm. In the final step, the Aluminum #200 is introduced into the pan and mixed for 1 to 2 minutes at a speed of 2000 rpm. The temperature during mixing is monitored. The mixing is temporarily suspended if the temperature exceed 100° F.

EXAMPLE 3

This example provides a preferred copper decorative metallic composition according to the invention. The decorative metallic composition was made from the following components:

| Component | Approximate Weight % |
| --- | --- |
| IBOA | 28.0 |
| IRGACURE 1700 | 10.0 |
| Ebecryl 3603 | 38.0 |
| Modaflow | 4.0 |
| Palegold #400 | 20.0 |
| Copper | |
| Total | 100.00 |

In this example the IBOA and Irgacure 1700 are mixed in a pan with a propeller blade mixer for 30 seconds at a speed of 500 to 1000 rpm. In the next step, the Modaflow and the Ebecryl 3603 are introduced into the pan and mixed for 1 to 2 minutes at a speed of 2000 rpm. In the final step, the Palegold #400 is introduced into the pan and mixed for 1 to 2 minutes at a speed of 2000 rpm. The temperature during mixing is monitored. The mixing is temporarily suspended if the temperature exceed 100° F.

Method for Depositing an Decorative Metallic Coating on a Substrate

In accordance with still another aspect of the invention, a method is provided for depositing an decorative metallic coating on a suitable substrate. The method comprises a first step of applying a decorative metallic fluid-phase composition ("decorative metallic composition") to the substrate.

The decorative metallic composition comprises an acrylated epoxy oligomer in an amount of about 20% to 45%, an isobornyl acrylate monomer in an amount of about 15% to 40% of the decorative metallic composition, a photoinitiator in an amount of about 4% to 14% of the decorative metallic composition, a flow promoting agent in an amount of 0% to 8%of the decorative metallic composition, and a metallic pigment in an amount of 5% to 40%. The preferred decorative metallic compositions according to this method are those described herein, for example, including the compositions described in examples 1, 2, and 3.

The decorative metallic composition may be applied to the substrate using a number of different techniques. The decorative metallic composition may be applied, for example, by direct brush application, dipping, or it may be sprayed onto the substrate surface. It also may be applied using a screen printing technique. In such screen printing technique, a "screen" as the term is used in the screen printing industry is used to regulate the flow of liquid composition onto the substrate surface. The decorative metallic composition typically would be applied to the screen as the latter contacts the substrate. The decorative metallic composition flows through the silk screen to the substrate, whereupon it adheres to the substrate at the desired film thickness. Screen printing techniques suitable for this purpose include known techniques, but wherein the process is adjusted in ways known to persons of ordinary skill in the art to accommodate the viscosity, flowability, and other properties of the liquid-phase composition, the substrate and its surface properties, etc. Flexographic techniques, for example, using pinch rollers to contact the decorative metallic composition with a rolling substrate, also may be used.

The method includes a second step of illuminating the decorative metallic fluid-phase composition on the substrate with an ultraviolet light to cause the decorative metallic fluid-phase composition to cure into the decorative metallic coating. This illumination may be carried out in any number of ways, provided the ultraviolet light or radiation impinges upon the decorative metallic composition so that the decorative metallic composition is caused to polymerize to form the coating, layer, film, etc., and thereby cures.

Curing preferably takes place by free radical polymerization, which is initiated by an ultraviolet radiation source. The photoinitiator preferably comprises a photoinitiator, as described above.

Various ultraviolet light sources may be used, depending on the application. Preferred ultraviolet radiation sources for a number of applications include known ultraviolet lighting equipment with energy intensity settings of, for example, 125 watts, 200 watts, and 300 watts per square inch.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A photocurable decorative metallic composition comprising:

a novolac epoxy acrylated oligomer present in an amount of 20% to 45% of the weight of the metallic composition;

an isobornyl acrylate monomer present in an amount of 15% to 40% of the weight of the metallic composition;

a photoinitiator present in an amount of 4% to 14% of the weight of the metallic composition;

metallic pigment present in an amount of 5% to 40% of the weight of the metallic composition; and a flow promoting agent present in an amount of 0% to 8% of the weight of the metallic composition.

2. The metallic composition of claim 1, wherein the isobornyl acrylate monomer is selected from the group consisting of isobornyl acrylate, isobornyl methacrylate, and mixtures thereof.

3. The metallic composition of claim 1, wherein the photoinitiator is selected from the group consisting of:

1-hydroxycyclohexyl phenyl ketone;

2-methyl-1-[4-(methylthio)phenyl]-2-morpholino propan-1-;

the combination of 50% 1-hydroxy cyclohexyl phenyl ketone and 50% benzophenone;

2,2-dimethoxy-1,2-diphenylethan-1-one;

the combination of 25% bis(2,6-dimethoxybenzoyl-2,4-, 4-trimethyl pentyl phosphine oxide and 75% 2-hydroxy-2-methyl-1-phenyl-propan-1-one;

2-hydroxy-2-methyl-1-phenyl-1-propane;

the combination of 50% 2,4,6-trimethylbenzoyldiphenyl-phosphine oxide and 50% 2-hydroxy 2-methyl-1-phenyl-propan-1-one;

mixed triaryl sulfonium hexafluoroantimonate salts, mixed triaryl sulfonium hexafluorophosphate salts; and mixtures thereof.

4. The metallic composition of claim 1, wherein the novolac epoxy acrylated oligomer comprises:

novolac epoxy acrylate diluted 20% by weight with tripropylene glycol diacrylate.

5. The metallic composition of claim 1, wherein:

the novolac epoxy acrylated oligomer is present in an amount of 35% to 45% of the weight of the metallic composition;

the isobornyl acrylate monomer is present in an amount of 25% to 35% of the weight of the metallic composition;

the photoinitiator is present in an amount of 8% to 12% of the weight of the metallic composition;

the metallic pigment is present in an amount of 10% to 25% of the weight of the metallic composition; and the flow promoting agent is present in an amount of 0% to 8% of the weight of the metallic composition.

6. The metallic composition of claim 5, wherein:

the novolac epoxy acrylated oligomer is present in an amount of 38% of the weight of the metallic composition;

the isobornyl acrylate monomer is present in an amount of 28% of the weight of the metallic composition;

the photoinitiator is present in an amount of 10% of the weight of the metallic composition;

the metallic pigment is present in an amount of 20% of the weight of the metallic composition; and the flow promoting agent is present in an amount of 4% of the weight of the metallic composition.

7. A method for coating a substrate with a photocurable metallic composition, the method comprising:

applying the metallic composition to the substrate, wherein the metallic composition comprises:

a novolac epoxy acrylated oligomer present in an amount of 20% to 45% of the weight of the metallic composition;

an isobornyl acrylate monomer present in an amount of 15% to 40% of the weight of the metallic composition;

a photoinitiator present in an amount of 4% to 14% of the weight of the metallic composition;

metallic pigment present in an amount of 5% to 40% of the weight of the metallic composition;

a flow promoting agent present in an amount of 0% to 8% of the weight of the metallic composition; and illuminating the metallic composition with UV light such that the metallic composition is caused to form the coating as it cures.

8. The method of claim 7, wherein the method of applying the metallic composition is spraying.

9. The method of claim 7, wherein the method of applying the metallic composition is screen printing.

10. The method of claim 7, wherein the method of applying the metallic composition is dipping the substrate into the composition sufficiently to cause the composition to uniformly coat the substrate.

11. The method of claim 7, wherein the method of applying the metallic composition is brushing.

12. The method of claim 7, wherein:

the novolac epoxy acrylated oligomer is present in an amount of 35% to 45% of the weight of the metallic composition;

the isobornyl acrylate monomer is present in an amount of 25% to 40% of the weight of the metallic composition;

the photoinitiator is present in an amount of 8% to 12% of the weight of the metallic composition;

the metallic pigment is present in an amount of 10% to 25% of the weight of the metallic composition; and the flow promoting agent is present in an amount of 0% to 8% of the weight of the metallic composition.

13. The method of claim 12, wherein:

the novolac epoxy acrylated oligomer is present in an amount of 38% of the weight of the metallic composition;

the isobornyl acrylate monomer is present in an amount of 28% of the weight of the metallic composition;

the photoinitiator is present in an amount of 10% of the weight of the metallic composition;

the metallic pigment is present in an amount of 20% of the weight of the metallic composition; and the flow promoting agent is present in an amount of 4.0% of the weight of the metallic composition.

14. A method of making a photocurable metallic composition comprising:

mixing an isobornyl acrylate monomer and a photoinitiator in a pan;

introducing a flow promoting agent and a novolac epoxy acrylated oligomer into the pan;

mixing the flow promoting agent and the novolac epoxy acrylated oligomer;

introducing metallic pigment into the pan; and mixing the metallic pigment in the pan.

* * * * *